(12) United States Patent
Lu et al.

(10) Patent No.: US 6,218,320 B1
(45) Date of Patent: Apr. 17, 2001

(54) METHOD FOR IMPROVING THE UNIFORMITY OF WAFER-TO-WAFER FILM THICKNESS

(75) Inventors: Tsung-Lin Lu, Tainan Hsien; Ping-Chung Chung, Hsinchu Hsien; Yun-Sueng Liou, Miao-Li; Yung-Chun Wen, Hsinchu; Tsang-Jung Lin, Chungli, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/222,654

(22) Filed: Dec. 30, 1998

(30) Foreign Application Priority Data

Jun. 30, 1998 (TW) .................................................. 87110515

(51) Int. Cl.$^7$ .................................................. H01L 21/31
(52) U.S. Cl. .................... 438/788; 438/792; 438/798; 427/570; 427/585
(58) Field of Search .................... 427/522, 255.6, 427/490, 570, 585; 438/786, 788, 14, 15, 16, 18, 792, 798

(56) References Cited

U.S. PATENT DOCUMENTS 5,120,680 * 6/1992 Foo et al. ............................. 438/788
5,888,591 * 3/1999 Gleason et al. ...................... 427/522

* cited by examiner

Primary Examiner—David Nelms
Assistant Examiner—Reneé R. Berry
(74) Attorney, Agent, or Firm—Jaiwei Huang; J.C. Patents

(57) ABSTRACT

A method for improving the uniformity of wafer-to-wafer film thicknesses. Before depositing films, shower heads in a PECVD system is heated to production temperature to make the entire system (including the shower heads) reach a stable temperature in coordination with heating of a heater block. Subsequently, a gas source, output via the shower heads, is provided, and then a plasma of the gas source is generated to form a film on the wafer due to the temperatures of the shower heads remain constant during wafers deposition. Therefore, the problem of the uneven thicknesses of films among wafers is resolved. Moreover, if the heating of the shower heads by use of a plasma (which can also be used to heat the heater block) and the heater block is concurrently performed after the preventive maintenance (PM) or open chamber cleaning of the PECVD system, the heating time of the heater block can be further shortened.

8 Claims, 3 Drawing Sheets

METHOD FOR IMPROVING THE UNIFORMITY OF WAFER-TO-WAFER FILM THICKNESS

CROSS-REFERENCE TO RELATED APPLICATION

This application claims the priority benefit of Taiwan application serial no. 87110515, filed Jun. 30, 1998, the full disclosure of which is incorporated herein by reference.

BACKGROUND OF THE INVENTION

1. Field of the Invention

The invention relates to a method for forming films, and in particular to a method for improving the uniformity of wafer-to-wafer film thicknesses used in a plasma-enhanced chemical vapor deposition (PECVD) reactor.

2. Description of the Related Art

A PECVD system includes a reactor, a gas transmission system, an exhaust system, and a process control system. This specification focuses on the reactor while the other systems not related to the invention are not further described. The Novellus PECVD system is taken as an example, and the reactor system thereof is shown in FIG. 1. In FIG. 1, an RF power source 12 is applied to 6 shower heads 14 in a reactor 10, and 6 wafers 16 is placed on a heater block 18, such that the wafers 16 is opposite to the shower head 14.

The PECVD system is typically used to deposit dielectric films. In semiconductor technology, two metal layers are isolated by a dielectric layer for the purpose of insulation. Therefore, the property, quality and thickness of the dielectric layer are significant considerations.

As an example, a tetra-ethyl-ortho-silicate (TEOS) is traditionally used to serve as a dielectric layer for isolating metal layers. In the Novellus PECVD system, a TEOS layer is deposited at a high temperature of 300–400° C. Furthermore, the shower head 14 does not have any temperature control device mounted on it and the thicknesses of TEOS layers are determined only by setting a deposition time. Therefore, the unstable temperature of the shower heads causes the TEOS layers to be deposited with varying thicknesses on the first several wafers. The temperature of the shower heads 14 stabilizes only after a certain number of wafers have been subjected to a deposition process. Once the temperature stabilizes, the thicknesses of the TEOS layers can also reach a uniform value. Referring to FIG. 2, the y-axis indicates the thicknesses of TEOS layers or the temperature of the shower heads while the x-axis indicates the number of wafers on which the deposition process has been completed.

Therefore, when TEOS layers are deposited by using a prior PECVD system, the uniformity of the thicknesses of the TEOS layers varies from batches to batches. The obvious difference in thickness among the wafers makes the quality of products very difficult to control, resulting in poor yield.

Moreover, after the PECVD system operates for a period of time, it is necessary to perform preventive maintenance or open chamber clean for the system to continue to work properly. However, it takes time to heat the heater block to production temperature, increasing the time required to start the PECVD system after implementing preventive maintenance or cleaning.

SUMMARY OF THE INVENTION

A first object of the invention is to provide a method which is able to resolve the problem of the uneven thicknesses of films on wafers.

A second object of the invention is to provide a method which not only avoids poor uniformity among films on wafers after finishing preventive maintenance or cleaning, but also shortens the heating time of the heater block in a PECVD system.

To attain the objects mentioned above, a method for manufacturing film by using a PECVD system according to the invention includes the following steps. Prior to film deposition, a shower head in a PECVD system is heated to production temperature by use of a plasma in coordination with heating of a heater block, thereby allowing the entire system (including the shower head) to reach a stable temperature. Subsequently, a gas source output via the shower head is provided, and then a RF plasma is generated to form a film on a wafer. Therefore, the problem of the uneven thicknesses of films on wafers is resolved.

In addition, if the shower heads and the heater block are concurrently heated, wherein the heater block can also be heated by the plasma after preventive maintenance or open chamber cleaning the PECVD system, the heating time of the heater block is further shortened.

Moreover, since a temperature measuring device and/or a heating element additionally mounted on the shower heads accurately measures the temperature of the shower heads, the time taken to heat the shower heads is optimized. And since the heating element can be used to cooperate with or displace the step of plasma heating, the temperature of the shower heads is easily controlled.

BRIEF DESCRIPTION OF THE DRAWINGS

The present invention will be more fully understood from the detailed description given hereinbelow and the accompanying drawings which are given by way of illustration only, and thus do not limit the present invention, and wherein.

DETAILED DESCRIPTION OF THE EMBODIMENTS

Figure 3:
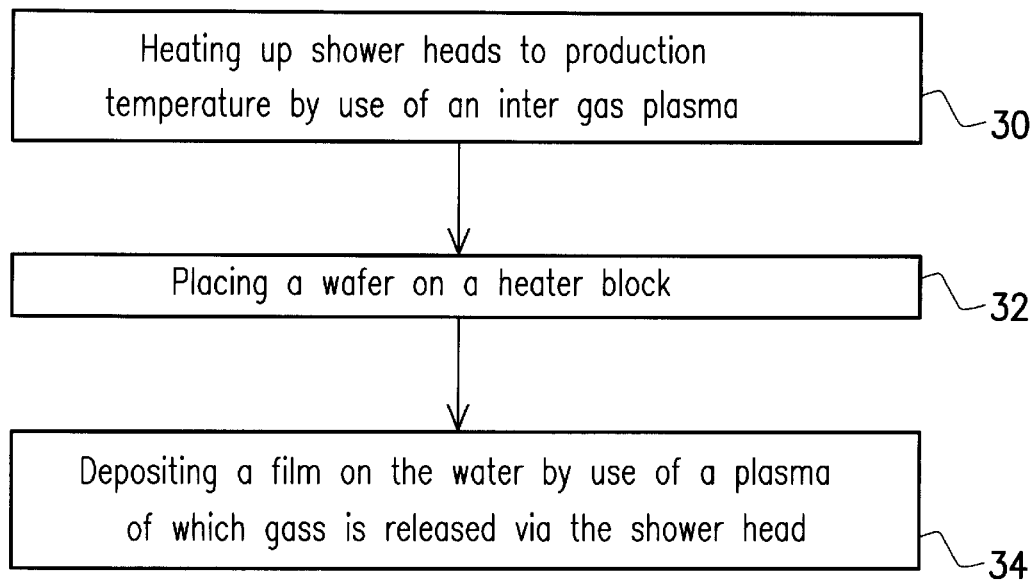
FIG. 3 a flow chart showing a method for manufacturing films according to a preferred embodiment of the invention.

Referring to FIG. 3, step 30 is "heating shower heads to production temperature by use of an inert gas plasma". Step 32 is "placing a wafer on the heater block". Step 34 is "depositing a film on the wafer by use of a plasma of which gases are output via the shower heads."

To resolve the poor uniformity of wafer-to-wafer film thicknesses among wafers, as shown in step 30, first an inert gas plasma is used to heat the shower head to production temperature in coordination with heating of a heater block. The heating process allows the temperature of the entire system to reach a stable state, such that the thickness of the film formed on each wafer in the subsequent steps is kept at a constant value. The inert gas can be selected from a group including Ar, $N_2$, $H_2$ and $O_2$, from which the plasma is generated for heating only and does not have any depositing or etching actions on elements.

Figure 4:
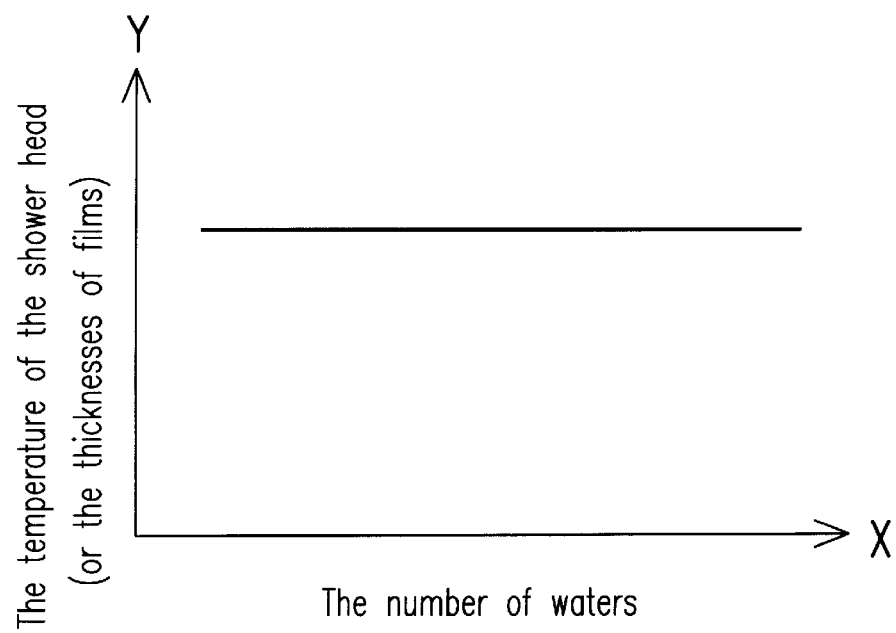
FIG. 4 is a graph showing the relationship between the number of wafers that have already passed through a deposition process and the thicknesses of deposited films or the temperature of shower heads according to a preferred embodiment of the invention.

Next, as shown in step 32, a wafer is placed on the heater block, wherein the wafer is opposite to the shower heads. Then, as shown in step 34, a gas source output via the shower heads is provided, and then a plasma is generated to deposit a film on the wafer, wherein the gas source serves as a precursor gas for the deposited film. For example, a TEOS vapor source is used to deposit a TEOS based oxide film. Since the temperature of the shower heads has already reached a stable value for deposition, the film deposited on each wafer has the same thickness. Referring to FIG. 4, the y-axis indicates the thicknesses of the deposited films or the temperature of the shower heads while x-axis indicates the number of wafers which have been through a deposition process.

Figure 5:
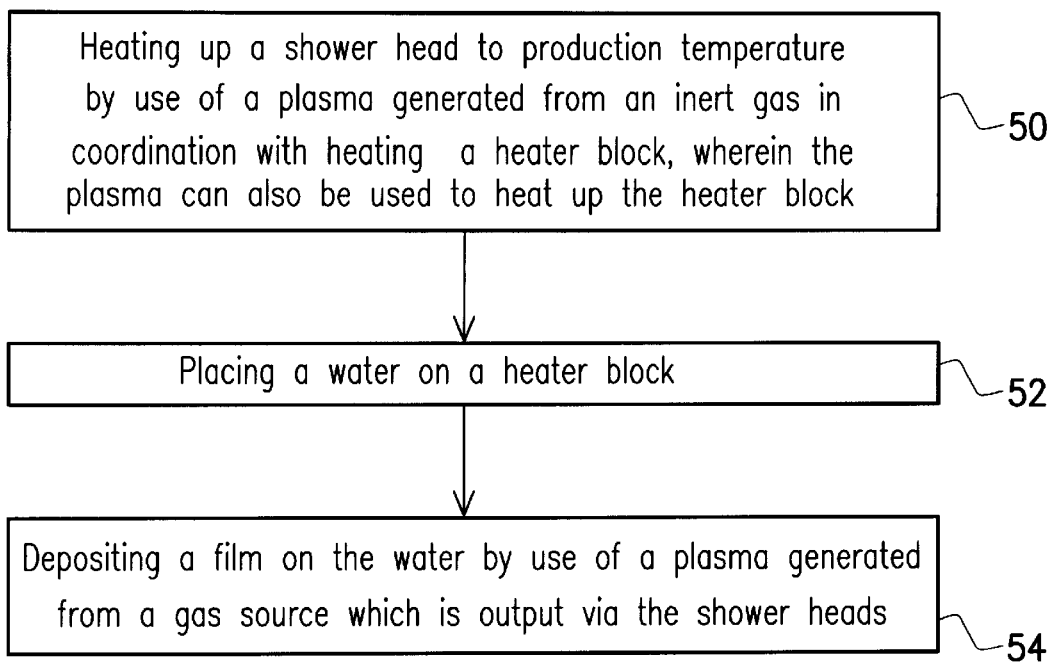
FIG. 5 is a flow chart showing a method for manufacturing films after implementing preventive maintenance or open chamber cleaning of the system according to another embodiment of the invention.

Generally, after the PECVD system operates for a period of time, it is necessary to perform preventive maintenance or to open chamber clean the system, so that the system continues to work properly. In the invention, the heater block 18 is heated to production temperature. wherein the heater block 18 is simultaneously heated by the plasma generated from the inert gas after finishing the preventive maintenance or open chamber cleaning. Referring to FIG. 5, step 50 is "heating the shower heads to production temperature with the plasma generated from the inert gas in coordination with heating the heater block, wherein the plasma can also be used to heat the heater block. Step 52 is "Placing a wafer on the heater block"; and step 54 is "depositing a film on the wafer by use of a plasma of which gases are output via the shower heads, wherein the gas source serves as a precursor gas for the deposited films.

In order to completely avoid the poor uniformity of deposited wafer-to-wafer film thicknesses and shorten the heating time of the heater block in the invention, a shower head is heated to production temperature by use of a plasma generated from an inert gas in coordination with heating of a heater block. The plasma can also be used to heat the heater block (shown in step 50) after open chamber cleaning the PECVD system and before depositing films. As a result, the heating time of the heater block is shortened, and the temperature of the entire system reaches a stable state. Furthermore, the thickness of the film formed on each wafer is uniform. Furthermore, the above-mentioned inert gas can be chosen from the group including Ar, $N_2$, He or $O_2$, from which the plasma generated is for heating only and does not have any depositing or etching actions on the reactor.

Thereafter, wafers are placed on the heater block, such that the wafers are opposite to the shower heads as shown in step 52. Then, as shown in step 54, a gas source output via the shower heads is provided, and then a plasma is generated to deposit a film on the wafer. Since the shower heads have already reached a stable temperature for deposition, the thickness of the film deposited on each wafer is uniform.

Figure 6:
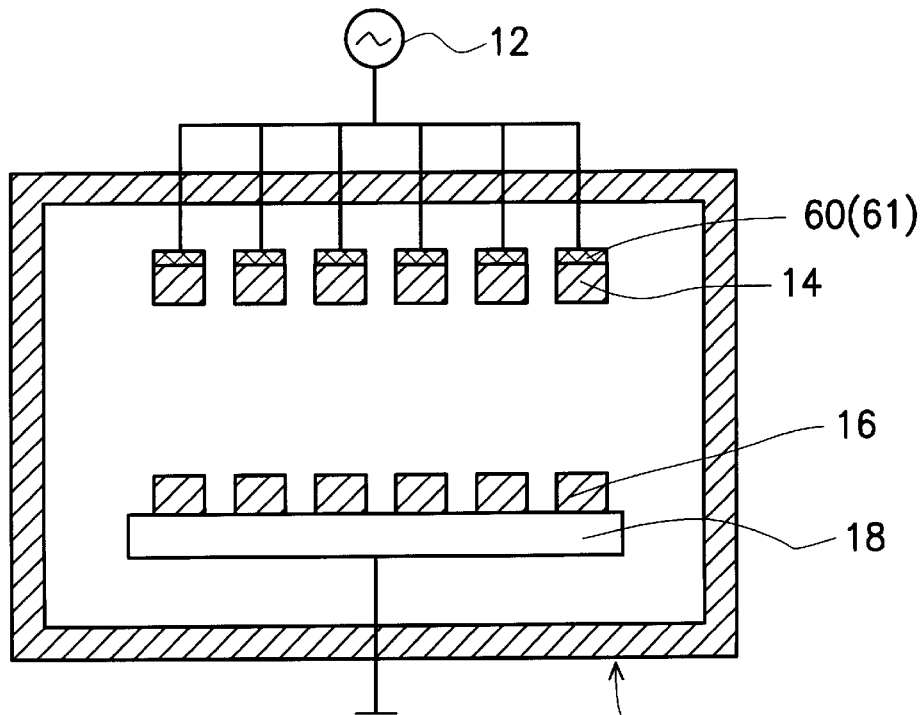
FIG. 6 is a schematic view showing the reactor of a PECVD system according to a preferred embodiment of the invention.

Moreover, a temperature-measuring device 60, such as a thermocouple or an infrared pyrometer, can be additionally mounted on the shower heads 14 as shown in FIG. 6. In this way, not only is the time taken to heat the shower heads 14 to production temperature optimized, but the temperature of the shower heads can be precisely controlled as well.

Figure 1:
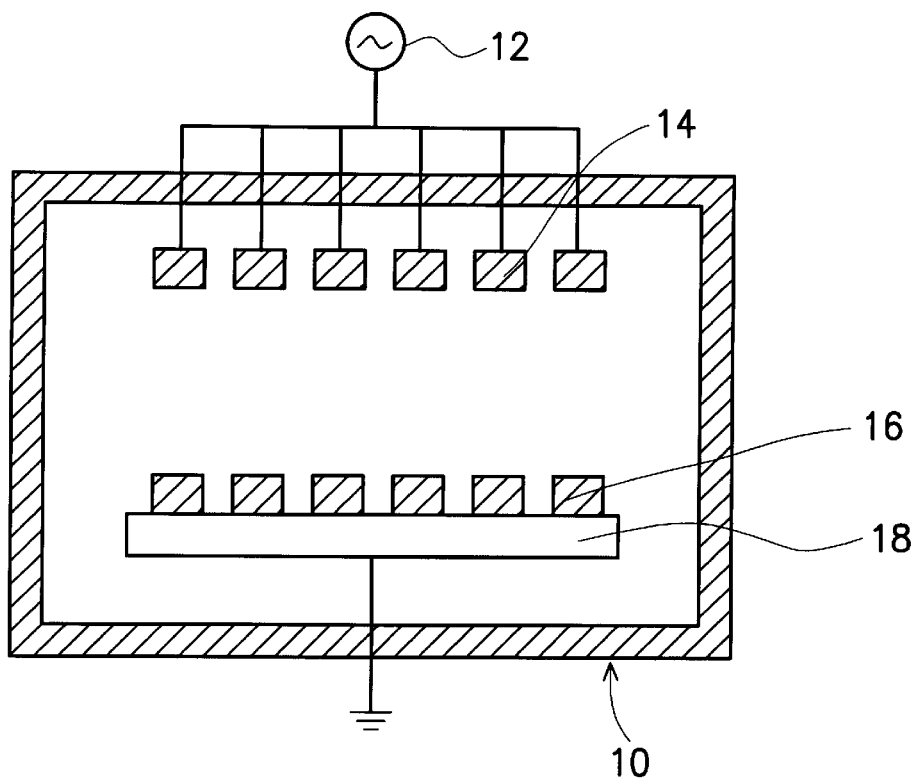
FIG. 1 is a brief view showing a PECVD system.
Figure 2:
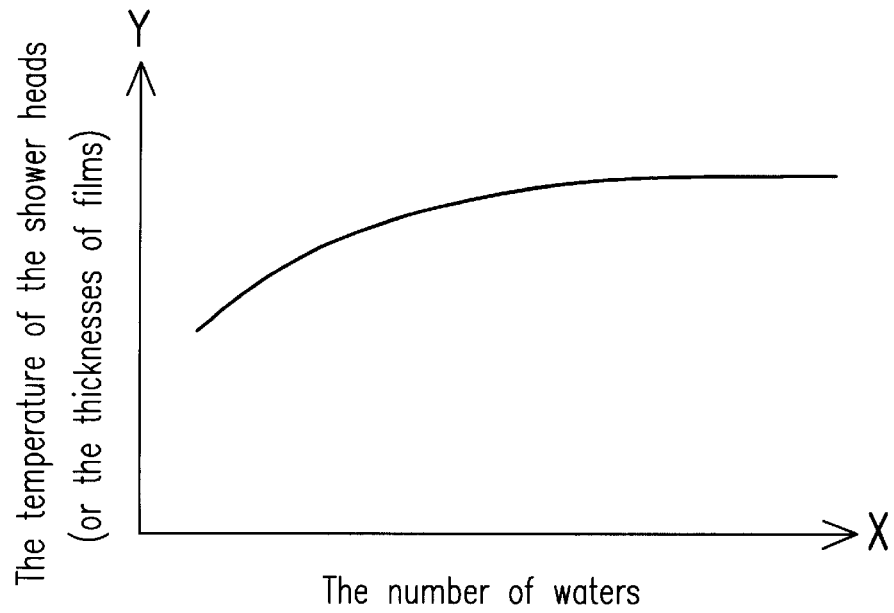
FIG. 2 is a graph showing the relationship between the number of wafers that have already passed through a deposition process and the thicknesses of deposited films or the temperature of shower heads according to the prior art.

In addition, as shown in FIG. 6, a heating element 61, such as a resistance heater, can be mounted on the shower heads instead of or in addition to the temperature-measuring device 60. In FIG. 6, parts being the same as those of FIG. 1 are labeled with the same reference numbers and will not be further described. Using the heating element either in cooperation with or in place of the previous heating step, the temperature of the shower heads 14 can be further flexibly controlled and properly adjusted to obtain a more stable temperature. Therefore, the uniformity of films formed on the wafers is efficiently improved.

The advantages of the invention are described hereinafter.

(1) The shower heads are heated to production temperature before deposition, thereby resolving the problem of uneven thicknesses of films formed on the wafers.

(2) The heating of the shower head by use of a plasma, and the heating of the heater block are concurrently performed, wherein the plasma can also be used to heat the heater block after implementing preventive maintenance or open chamber cleaning the PECVD system. Therefore, the heating time of the heater block is shortened and the problem of the uneven thicknesses of films formed on the wafers is resolved.

(3) Since the temperature measuring device is additionally mounted on the shower heads, not only can the time taken to heat the shower heads to production temperature is further shortened, but also the temperatures of the shower heads are further precisely controlled.

(4) When the heating element is also mounted on the shower heads, the temperature of the shower heads can be flexibly controlled.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for improving the uniformity of wafer-to-wafer film thicknesses, suitable for a plasma-enhanced chemical vapor deposition (PECVD) reactor which comprises shower heads and a heater block, wherein the heater block is positioned opposite to the shower heads, comprising the steps of:

heating the shower heads to a temperature by using a second plasma, wherein the second plasma is generated from a gas selected from the group consisting of Ar, $N_2$, He and $O_2$, and wherein the second plasma is used for heating only;

then placing a wafer on the heater block, wherein the wafer is positioned opposite to the shower heads; and depositing a film on the wafer by use of a first plasma of gases which are output via the shower heads.

2. A method for improving the uniformity of wafer-to-wafer film thicknesses as claimed in claim 1, wherein the heater block is also heated by using the second plasma.

3. A method of improving the uniformity of wafer-to-wafer film thickness as claimed in claim 1, wherein the shower heads is heated to a production temperature.

4. A method for improving the uniformity of wafer-to-wafer film thicknesses as claimed in claim 1, wherein the PECVD reactor further comprises a temperature-measuring device mounted on the shower heads.

5. A method for improving the uniformity of wafer-to-wafer film thicknesses as claimed in claim 4, wherein the temperature-measuring device is used for measuring and controlling the temperature of the shower heads.

6. A method for improving the uniformity of wafer-to-wafer film thicknesses as claimed in claim 4, wherein the temperature-measuring device is selected from a group of instruments including a thermocouple and an infrared pyrometer.

7. A method for improving the uniformity of wafer-to-wafer film thickness as claimed in claim 1, wherein the gas source of the first plasma is a TEOS vapor.

8. A method for improving the uniformity of wafer-to-wafer film thicknesses as claimed in claim 1, wherein the film is a dielectric film.

* * * * *